United States Patent [19]
Machida

[11] Patent Number: 5,615,166
[45] Date of Patent: Mar. 25, 1997

[54] SEMICONDUCTOR MEMORY INTEGRATED CIRCUIT

[75] Inventor: Toru Machida, Chiba, Japan

[73] Assignee: Seiko Instruments Inc., Japan

[21] Appl. No.: 437,501

[22] Filed: May 9, 1995

[30] Foreign Application Priority Data

May 17, 1994 [JP] Japan .................................. 6-102613

[51] Int. Cl.$^6$ ................................................. G11C 13/00
[52] U.S. Cl. ............................... 365/230.08; 365/189.04; 365/201
[58] Field of Search ......................... 365/189.01, 189.04, 365/189.05, 189.09, 230.01, 230.08, 201

[56] References Cited

U.S. PATENT DOCUMENTS 5,088,062  2/1992  Shikata ............................... 365/189.05

Primary Examiner—Terrell W. Fears
Attorney, Agent, or Firm—Adams & Wilks

[57] ABSTRACT

It is an object of the invention to provide a semiconductor memory integrated circuit wherein the sate of all of the memory cells in the memory array can be checked by measuring only one data output terminal. A means for interconnecting read signal buses is provided to connect the read signal buses to each other. A multiplicity of IC chips can be simultaneously measured and inspected even if the numbers of the drivers, comparators and DC measuring units, and the like available in the inspection apparatus used are limited.

10 Claims, 4 Drawing Sheets

SEMICONDUCTOR MEMORY INTEGRATED CIRCUIT

BACKGROUND OF THE INVENTION

The present invention relates to a data output circuit of a semiconductor memory integrated circuit device.

Semiconductor memory integrated circuit devices having a mechanism for outputting read signals from a memory array to data output terminals as shown in FIG. 2 have been known.

The operation thereof will be described with reference to the drawings. To make the description more concrete and clearer, it will be focused on a semiconductor nonvolatile memory device comprised of electrically rewritable nonvolatile memory cells.

In order to improve data processing efficiency per unit operation, most general memory devices use a plurality of data structures, and the following description will be focused on devices having a data length of eight bits (one byte).

Nonvolatile memory cells are arranged in the form of a matrix in a memory array 1. To read one byte of memory contents, a signal is first input to word selection signal input lines 2 to select and validate one of a plurality of word lines.

Read output signals from nonvolatile memory cells for a plurality of bytes selected as described above are transmitted to a column selector 4, and only read output signals of one byte are transmitted to read signal buses 5 in accordance with a signal input to column selection signal input lines 3.

Then, the one byte of signals for the selected nonvolatile memories which have been transmitted to the read signal buses 5 are subjected to signal amplification by eight sense amplifiers 6 and are output to data input/output terminals 8 through output buffers 7.

The above-described series of operation is referred to as a "read operation" and is performed not only in nonvolatile memories but also in SRAM's and DRAM's.

The signals readout from the memory cells selected from among the memory array 1 are amplified and determined by the sense amplifier 6 and are assigned to a logical amplitude of "0" or "1". In the case of a nonvolatile memory cell, however, the amplitude of a signal readout from a memory cell is inherently continuous and is not expressed as a binary potential in a logical amplitude. In this case, therefore, what is important is the magnitude of the threshold voltage of a nonvolatile memory cell transistor 19 (see FIG. 4). Then, for the purpose of checking the state of memory cells in greater detail, a means is provided for outputting signal on the read signal buses 5, to which the signal out from the memory cells is transmitted, to the data input/output terminals 8 through a read signal transmission transistor 9. This makes it possible to check the state of the memory cells which have been selected from the memory array 1 in detail.

In a normal read operation using sense amplifiers, it is not possible to check the state of memory cells which can continuously change as a continuous quantity. Therefore, as described above, the read signal transmission transistor 9 is provided to apply a signal to a test signal input TA 10, thereby allowing the measurement of the state of the memory cells, more specifically, the threshold voltage thereof. This is a widely followed practice for semiconductor integrated memory circuits utilizing nonvolatile memory cells. It is very important in testing semiconductor memory integrated circuits to eliminate (screen) IC chips having initial defects and reliability problems.

The measurement of the threshold voltage will be further described. FIG. 4 shows an example of the configuration of a nonvolatile memory array illustrating the contents of the memory array 1 shown in FIG. 2 in greater detail.

A nonvolatile memory cell 21 as one memory unit is constituted by a transistor for selection 18 and a nonvolatile memory cell transistor 19. The transistor for selection 18 is an enhancement-type transistor which has a positive threshold voltage and is turned on and off by signals applied to a word line 16. On the other hand, the threshold voltage of the nonvolatile memory cell transistor 19 continuously changes from a depletion type to an enhancement type due to its unique structure. In addition, the threshold voltage is characterized in that it is maintained even when the power supply of the IC is disconnected.

The word selection signal input lines 2 are connected to the word lines 16. One word line is selected from among the plurality of word lines arranged to horizontally extend in FIG. 4. As a result, the drain side of the nonvolatile memory cell transistor 19 is connected to a bit line 17 through the transistor for selection 18. On the other hand, the bit lines 17 arranged to vertically extend are connected to the column selector 4 in FIG. 2, and are output to data input/output terminals 8 through a read bus 5 and the read signal transmission transistor 9.

In this state, the state of the nonvolatile memory cell transistor 19 can be determined by connecting a voltage source to the data input/output terminal 8 and by measuring the current flowing into the IC chip. Further, it is apparent that the state of the nonvolatile memory cell transistor 19 can be measured in greater detail if it is possible to apply a variable voltage to a control gate electrode 20 of the nonvolatile memory cell transistor 19 from the outside of the IC chip.

In conventional configurations of memory read circuits, however, in order to make detailed measurement of the state of memory cells, a plurality of data input/output terminals must be measured one by one by connecting them to a voltage source and a current measuring device. This has resulted in a problem especially in the case of semiconductor memory integrated circuits having a large data length in that measurement of the entire memory array takes an extremely long time.

In addition, in the field of semiconductor memory integrated circuits, there is a problem in that increasing memory capacity of such devices has been expanding the time required for testing the IC chips during the inspection of the same. It is desired to increase the number of IC chips tested in a limited period of time without reducing the quality of the testing. What is needed is to improve throughput with the quality of inspections on IC chips maintained.

Under the circumstances as described above, a plurality of IC chips are simultaneously measured in actual inspection steps for semiconductor memory integrated circuits. However, limitations on inspection equipments place a limit on the quantity of IC chips which can be simultaneously measured. Since the numbers of drivers, comparators, and DC measuring units included in an inspection equipment is limited, the number of IC chips which can be simultaneously measured is reduced with an increase in the number of terminals of an IC chip.

SUMMARY OF THE INVENTION

In order to solve such problems in the prior art, it is an object of the present invention to provide a semiconductor memory integrated circuit having a circuit means which makes it possible to know the state of all of the memory cells in a memory array by measuring any one of a plurality of data input output terminals.

In order to solve the above-described problems, according to the present invention, there is provided a means for interconnecting read signal buses to which the output of a column selector is connected which makes it possible to know the state of all of the memory cells in a memory array by measuring one of the data input/output terminals.

Alternatively, in order to solve the above-described problems, according to the present invention, there is provided a means for inputting a plurality of sense amplifier outputs to a logic gate circuit and for outputting the output signals from the logic gate circuit to a data input/output terminal through a signal selection circuit which makes it possible to know the state of all of the memory cells in a memory array by measuring one of a plurality of the data input/output terminals.

In a semiconductor memory integrated circuit having the configuration as described above, read signal buses which are provided in a number corresponding to the data length of the same are interconnected by an interconnection transistor. As a result, signals output to the data input/output terminals which are provided in a quantity corresponding to the data length through a read signal transmission transistor are equivalent to each other.

In a semiconductor memory integrated circuit having the configuration as described above, the outputs of all of the sense amplifiers provided in a quantity corresponding to the data length are input a the logic gate circuit. This makes it possible to make a determination as to whether all the data has a logical value "0" or a logical value "1". The information determined by the logic gate circuit is output to one of the data input/output terminals.

It is therefore possible to check the state of all memory cells in a memory array by measuring one of the input/output terminals.

DETAILED DESCRIPTION OF THE PREFERRED EMBODIMENT

A first embodiment of the present invention will now be described with reference to the drawings.

Figure 1:
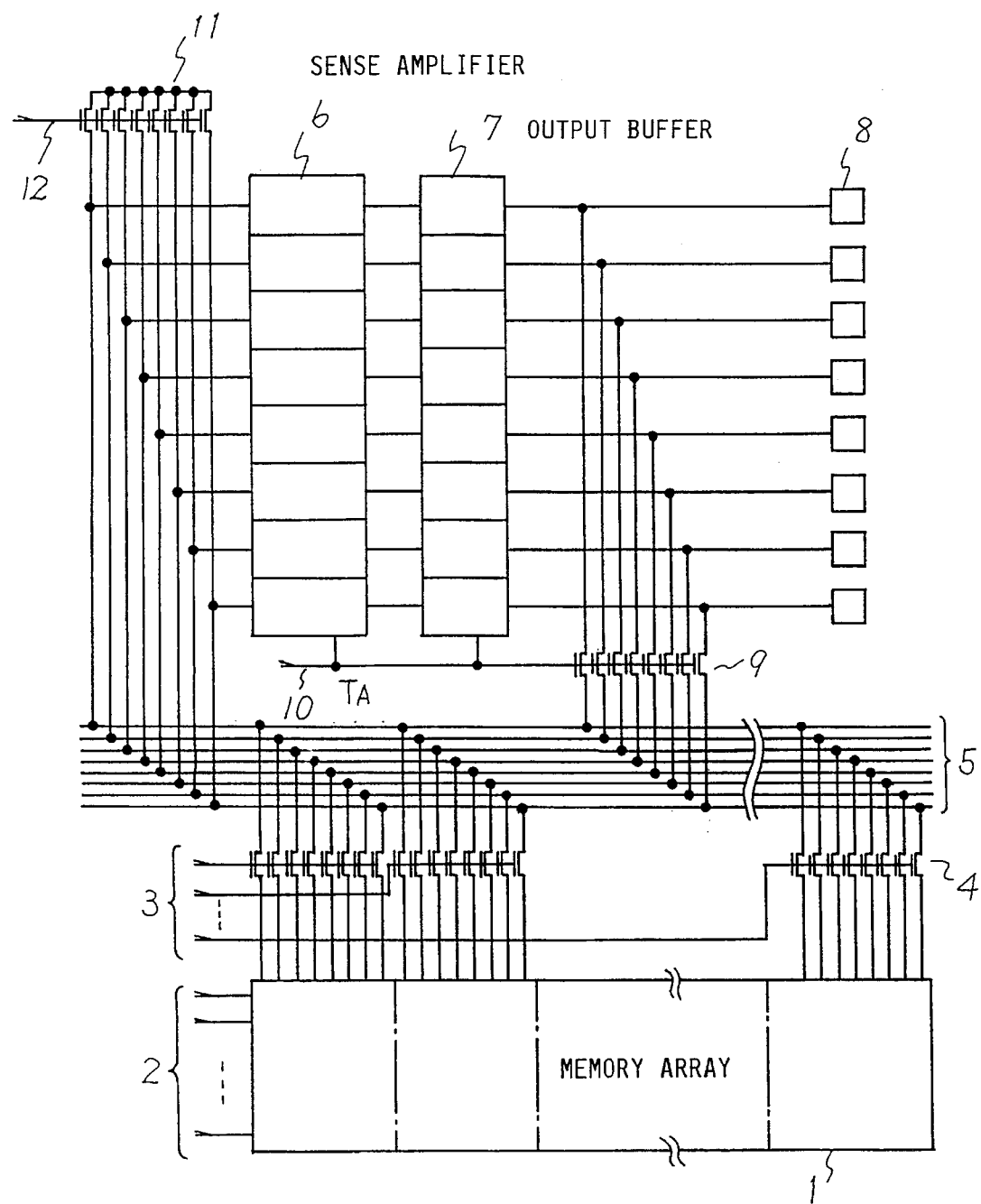
FIG. 1 shows a configuration of an embodiment of the present invention.
Figure 2:
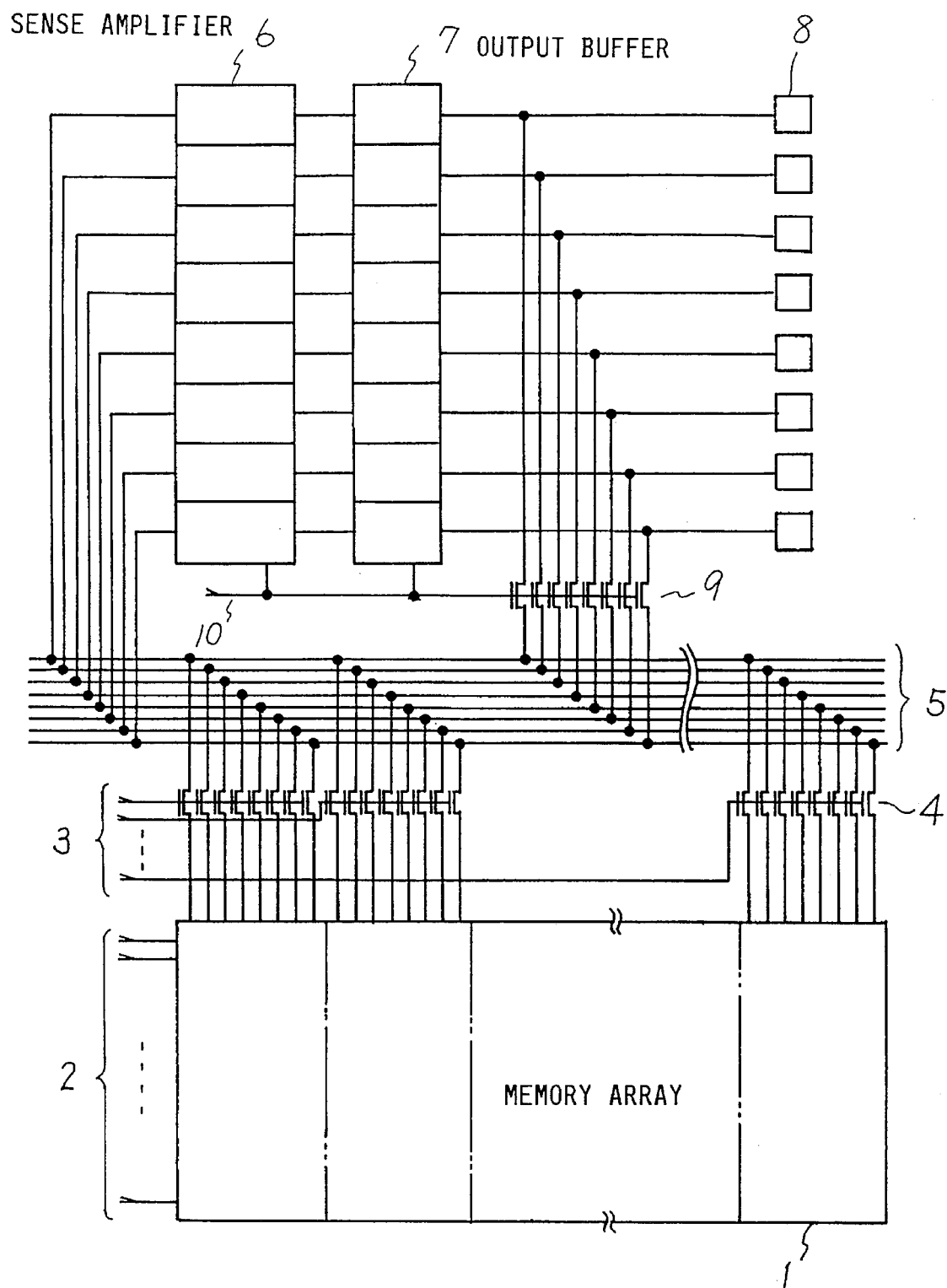
FIG. 2 shows a configuration of an embodiment of the prior art.
Figure 4:
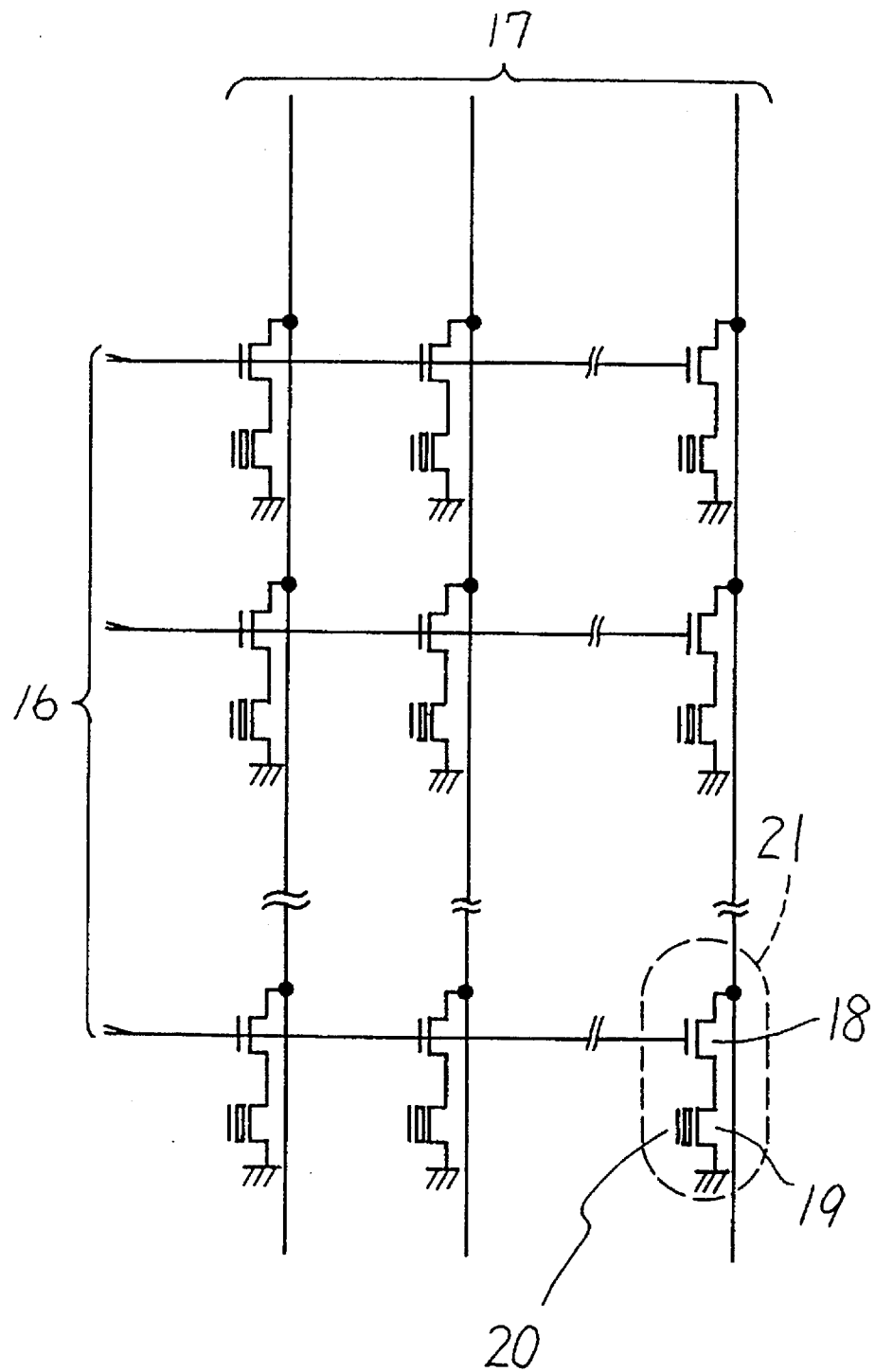
FIG. 4 shows a configuration of a nonvolatile memory array.

Referring to FIG. 1 and FIG. 4, when one of word lines 16 is selected, a column of memory cells among memory cells arranged in the form of a matrix in a memory array 1 are connected to a bit line 17. Signals from the bit line 17 are transmitted t, read signal buses 4 through a column selector 5. The signals transmitted to the read signal bus 5 at this time as a result of an operation of a column selection signal input 3 are signals corresponding to the length of the data selected by the column selector 4.

Next, by validating a test signal input TA 10, a read signal transmission transistor 9 is turned on to output the read signals from the selected memory cells on the read signal buses 5 to data input/output terminals 8.

At this time, the test signal input TA 10 also acts on the sense amplifiers 6 and output buffers 7 to disable them. Thus, the read signals from the selected memory cells are directly output to the data input/output terminals 8 without passing through or intervention of the sense amplifiers 6 and the output buffers 7.

Under such conditions, a voltage source and a current measuring device are connected to each of the data input/output terminals 8 to measure the current flowing into the memory cells in order to measure the state of the memory cells in detail. If it is possible to apply a voltage to a control gate electrode 20 of a nonvolatile memory cell transistor 19 from the outside of the IC, the voltage-current (V-I) characteristics of the nonvolatile memory cell transistor 19 can be obtained by measuring the current flowing into the memory cell with the voltage at the control gate electrode selectively varied.

When the nonvolatile memory cell transistor 19 is in an enhancement state, no current flows if the voltage applied to the control gate electrode 20 is 0 V. Then, the voltage applied to the control gate electrode 20 is gradually increased to cause current to flow. The value of the voltage at this time is generally defined as a threshold voltage (Vth) of the nonvolatile memory cell transistor.

Among the steps for inspecting a semiconductor nonvolatile memory integrated circuit, inspection of the state of individual memory cells is very important. All of the memory cells in the memory array are inspected to check whether they have the threshold voltage which they must have.

However, if the inspection apparatus has only one DC measuring unit for inspecting all the memory cells in the memory array 1 one by one, the measurement must be performed by sequentially switching the unit between the data output terminals 8 provided in a quantity corresponding to the data length. This takes an extremely long time.

The feature of the present invention which solves such a problem will now be described. First, a test signal input TB 12 is validated to turn on an interconnection transistor 11, thereby interconnecting the read signal buses 5. In such a state, by validating the test signal input TA 10, the read signal transmission transistor a is turned on to output the read signals from the selected memory cells. At this time, since the read signals from the selected memory cells are connected to each other, the same information will be obtained from any one of the data input/output terminals 8 provided in a quantity corresponding to the data length.

The voltage source and the current measuring device are connected to any one of the data input/output terminals 8 to measure the current flowing into the IC chip. If all of the selected memory cells are in the enhancement state and, hence, the voltage applied to the control gate electrode 20 is 0 V, no current flows. When the current flowing into the IC chip is further measured with the voltage applied to the control gate electrode 20 gradually increased, a current starts to flow when the voltage exceeds the threshold voltage of the memory cell having the lowest threshold voltage among the selected memory cells.

In other words, in such a state, it is possible to know the memory cell transistor having the lowest threshold voltage among the selected memory cells. In addition, it is not necessary to prepare the voltage source and current measuring device in a quantity corresponding to the data length, but only one DC measuring unit will be sufficient. Further, when it is desired to confirm that the memory cells have a value which is greater than a predetermined threshold voltage, it is possible to confirm that no current flows through the IC chip after only one cycle of measurement wherein a control gate voltage corresponding to the predetermined threshold voltage is applied and the current is checked using the DC measuring unit connected to one of the data input/output terminals 8.

In addition, if there is provided a means for validating all of the word selection signal input 2 and column selection signal input 3 simultaneously, it is apparent that only one cycle of measurement will allow confirmation to be made on whether all of the memory cells arranged in the memory array 1 have the predetermined threshold voltage.

A second embodiment of the present invention will now be described with reference to the drawings.

Figure 3:
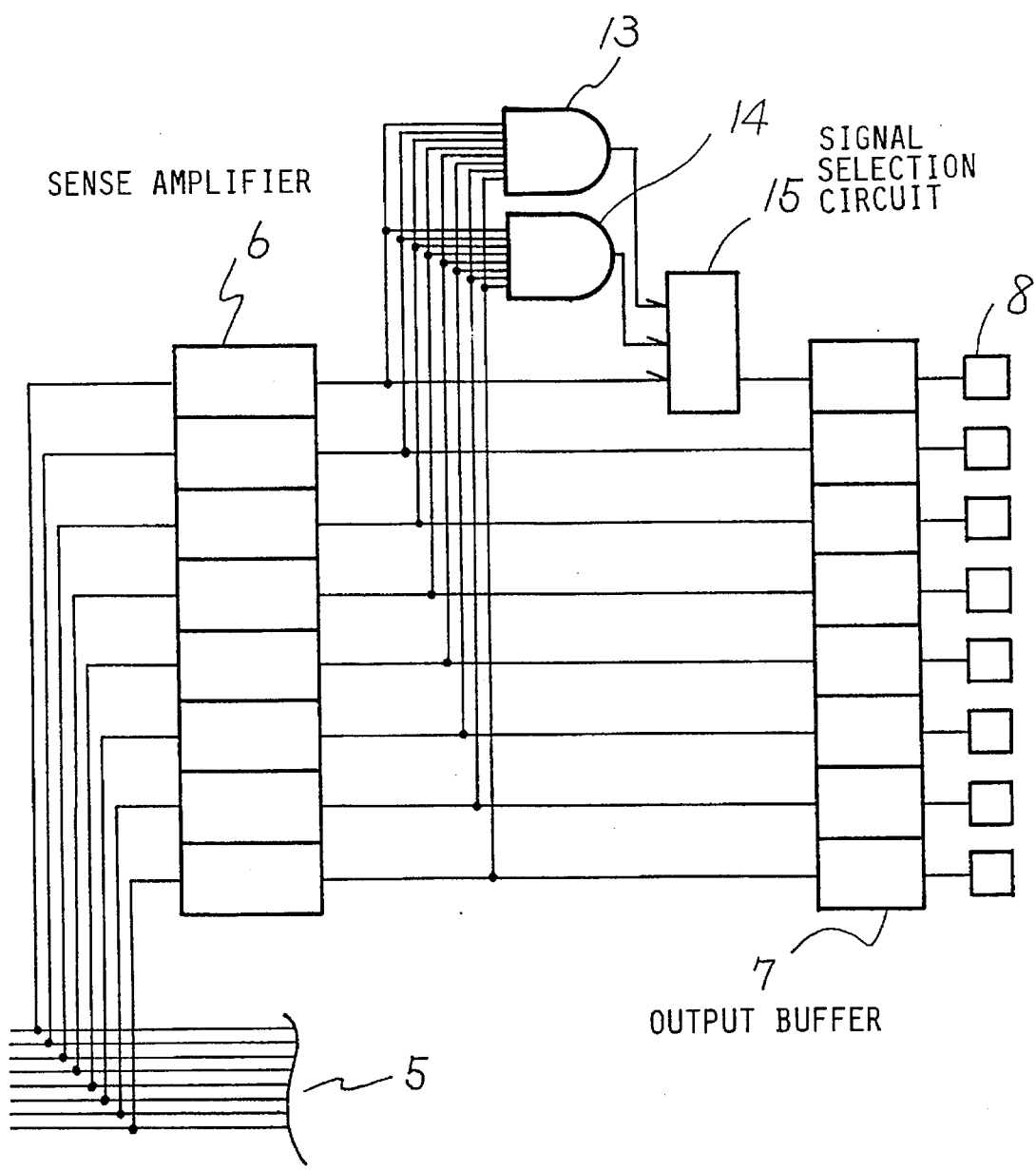
FIG. 3 shows a configuration of another embodiment of the present invention.

Referring to FIG. 3, all of the outputs from the sense amplifiers 6 provided in a quantity corresponding to the data length are input to an OR gate 13 and an AND gate 14 the outputs of which are input to a signal selection circuit 15. The outputs of the sense amplifiers 6 are also input to the signal selection circuit 15. One of those input signals is selected and output through an output buffer 7 to a data input/output terminal 8 as a binary potential in a logical amplitude. In a read data output circuit having such a configuration, the output of the OR gate 13 will be "0" only if all of the output signals from the sense amplifiers 6 are a logic signal "0". On the other hand, the output of the AND gate 14 will be "1" only if all of the output signals of the sense amplifiers 6 are a logic signal "1".

It is thus possible to know whether all of the memory cells in the memory array are in a "0" or "1" state by reading the logic signal at the single input/output terminal to which the output of the signal selection circuit 15 is connected from among the data input/output terminals 8.

As described above, the present invention employs a configuration wherein a transistor is provided to interconnect the read signal buses on which the read signals from the memory cells selected from among the memory arrays are transmitted. As a result, the state of the memory cells can be checked by monitoring only one data input/output terminal without measuring all of the plurality of data input/output terminals.

Further, a configuration is employed wherein a logic gate circuit and a signal selection circuit are provided; a plurality of sense amplifier outputs are input to the logic gate circuit; the output of the logic gate circuit is input to the signal selection circuit; and the output signal from the signal selection circuit is output to a data input/output terminal through an output buffer. As a result, it is possible to know whether all of the memory cells in the memory array are in a "0" or "1" state by reading the logic signal at only one of the plurality of data input/output terminals.

It is therefore possible to know the state of all the memory cells in the memory array by measuring only one of the plurality of data input/output terminals. This allows a multiplicity of IC chips to be simultaneously measured and inspected even if the numbers of the drivers, comparators and DC measuring units, and the like available in the inspection apparatus used are limited. Thus, there is an advantage in that the time required for measurement and inspection is reduced.

What is claimed is:

1. In a semiconductor memory integrated circuit device having means for outputting a plurality of data signals read out from a memory array to a plurality of data output terminals through a plurality of read signal lines, the improvement comprising: a means for electrically connecting the plurality of read signal lines to each other.

2. In a semiconductor memory integrated circuit device having means for outputting a plurality of data signals read out from a memory array to a data output terminal through a plurality of sense amplifiers and a plurality of output buffers, the improvement comprising: a logic circuit for performing a logical operation on output signals of the plurality of sense amplifiers; and a signal selection circuit for outputting to the data output terminal a signal selected from an output signal of the logic circuit or an output signal of a respective sense amplifier.

3. A memory device comprising: a memory array having a plurality of rows of word lines, a plurality of columns of bit lines, and a memory cell arranged at each intersection of a word line and a bit line; a plurality of word selection input lines connected to the memory array for applying a word selection input signal to the memory array to select a respective word line; a column selector connected to the memory array for applying a column selection input signal to the memory array to select a plurality of desired bit lines; a plurality of read signal lines connected to the column selector for receiving data signals from the selected bit lines; a sense amplifier circuit connected to the read signal lines for amplifying the data signals; an output buffer circuit for receiving output signals from the sense amplifier circuit; a plurality of output terminals connected to the output buffer circuit for outputting selected data signals; inspection means for selectively connecting the read signal lines and the output terminals in response to a first inspection signal; and means for connecting the read signal lines to each other in response to a second inspection signal, such that the signal at each of the output terminals is the same.

4. A memory device according to claim 3; wherein the inspection means includes means for disabling the sense amplifier circuit and the output buffer circuit in response to the first inspection signal.

5. A memory device according to claim 3; wherein the respective memory cells comprise nonvolatile memory cells.

6. A memory device according to claim 3; wherein the respective memory cells each comprise a selection transistor and a nonvolatile memory cell transistor.

7. A memory device according to claim 3; wherein each of the plurality of word selection input lines is connected to a respective one of the word lines of the memory array.

8. A memory device according to claim 3; wherein the means for connecting the read signal lines to each other comprises a plurality of parallel transistors connected to the read signal lines, and an input terminal for applying the second inspection signal to activate the plurality of transistors such that the read signal lines become short-circuited to each other during application of the second inspection signal.

9. A memory device comprising: a memory array having a plurality of rows of word lines, a plurality of columns of bit lines, and a memory cell arranged at each intersection of a word line and a bit line; a plurality of word selection input lines connected to the memory array for applying a word selection input signal to the memory array to select a respective word line; a column selector connected to the memory array for applying a column selection input signal to the memory array to select a plurality of desired bit lines; a plurality of read signal lines connected to the column selector for receiving data signals from the selected bit lines;

a sense amplifier circuit connected to the read signal lines for amplifying the data signals; an output buffer circuit for receiving output signals from the sense amplifier circuit; a plurality of output terminals connected to the output buffer circuit for outputting data signals; a logic circuit connected to outputs of the sense amplifier circuit; and a signal selection circuit connected to outputs of the sense amplifier circuit and the logic circuit for selectively outputting to an output terminal one of an output signal of the logic circuit and an output signal of the sense amplifier circuit.

10. A memory device according to claim 9; wherein the logic circuit comprises an OR gate having inputs connected to the outputs of the sense amplifier circuit and an AND gate having inputs connected to the outputs of the sense amplifier circuit such that the OR gate outputs a logic "0" level when all the outputs of the sense amplifier are at a logic "0" level and the AND gate outputs a logic "1" level when all outputs of the sense amplifier circuit are at a logic "1" level.

* * * * *